United States Patent
Meguro et al.

(10) Patent No.: US 10,312,324 B2
(45) Date of Patent: Jun. 4, 2019

(54) EPITAXIAL WAFER FOR HETERO-JUNCTION BIPOLAR TRANSISTOR AND HETERO-JUNCTION BIPOLAR TRANSISTOR

(71) Applicant: SUMITOMO CHEMICAL COMPANY, LIMITED, Tokyo (JP)

(72) Inventors: Takeshi Meguro, Hitachi (JP); Shinjiro Fujio, Hitachi (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 10 days.

(21) Appl. No.: 15/561,345

(22) PCT Filed: Jan. 12, 2016

(86) PCT No.: PCT/JP2016/050697
§ 371 (c)(1),
(2) Date: Sep. 25, 2017

(87) PCT Pub. No.: WO2016/152195
PCT Pub. Date: Sep. 29, 2016

(65) Prior Publication Data
US 2018/0061948 A1    Mar. 1, 2018

(30) Foreign Application Priority Data

Mar. 26, 2015 (JP) ................. 2015-064409

(51) Int. Cl.
*H01L 29/08* (2006.01)
*H01L 29/737* (2006.01)
(Continued)

(52) U.S. Cl.
CPC ........ *H01L 29/0821* (2013.01); *H01L 29/207* (2013.01); *H01L 29/66318* (2013.01); *H01L 29/7371* (2013.01); *H01L 29/20* (2013.01)

(58) Field of Classification Search
IPC .......................... H01L 29/0821,29/7371, 29/20
See application file for complete search history.

(56) References Cited

U.S. PATENT DOCUMENTS

| 2004/0089875 A1 | 5/2004 | Yagura |
| 2007/0090399 A1 | 4/2007 | Chin et al. |

(Continued)

FOREIGN PATENT DOCUMENTS

| JP | 2000-323491 A | 11/2000 |
| JP | 2003-303825 A | 10/2003 |

(Continued)

OTHER PUBLICATIONS

International Search Report for PCT/JP2016/050697 dated Apr. 5, 2016.

(Continued)

*Primary Examiner* — Hrayr A Sayadian
(74) *Attorney, Agent, or Firm* — Birch, Stewart, Kolasch & Birch, LLP

(57) ABSTRACT

An epitaxial wafer for a heterojunction bipolar transistor and a heterojunction bipolar transistor capable of reducing the resistance of the sub-collector layer without reducing the current amplification factor are provided. In an epitaxial wafer for a heterojunction bipolar transistor including a sub-collector layer made of n-type GaAs, the sub-collector layer contains n-type impurities having a covalent radius that is smaller than the covalent radius of the substitution site and n-type impurities having a covalent radius that is larger than the covalent radius of the substitution site.

4 Claims, 3 Drawing Sheets

(51) Int. Cl.
*H01L 29/66* (2006.01)
*H01L 29/207* (2006.01)
*H01L 29/20* (2006.01)

(56) References Cited

U.S. PATENT DOCUMENTS

2012/0326211 A1  12/2012  Stevens et al.
2013/0009212 A1  1/2013  Meguro et al.

FOREIGN PATENT DOCUMENTS

JP    2004-172582 A    6/2004
JP    2004-207548 A    7/2004
JP    2013-21024 A     1/2013

OTHER PUBLICATIONS

Ohno et al., "Sidewall GaAs tunnel junctions fabricated using molecular layer epitaxy", Science and Technology of Advanced Materials, Feb. 2, 2012, vol. 13, pp. 1-16.
International Preliminary Report on Patentability and Written Opinion of the International Searching Authority(Forms PCT/IB/373 and PCT/ISA/237) for International Application No. PCT/JP2016/050697, dated Sep. 26, 2017, with English translation.

EPITAXIAL WAFER FOR HETERO-JUNCTION BIPOLAR TRANSISTOR AND HETERO-JUNCTION BIPOLAR TRANSISTOR

TECHNICAL FIELD

The present invention relates to an epitaxial wafer for a compound semiconductor element and a compound semiconductor element, and more specifically, relates to an epitaxial wafer for a heterojunction bipolar transistor and a heterojunction bipolar transistor.

BACKGROUND ART

Heterojunction bipolar transistors (HBTs) are capable of ultra-high speed operation with low distortion, and are typically used for radio frequency power amplifiers (PAs) of transmitters in cell phones, local area networks (LANs), etc.

A heterojunction bipolar transistor has a thin-film multilayer structure including, for example, a sub-collector layer formed on a substrate made of semi-insulating GaAs, the sub-collector layer being made of n-type GaAs for outputting current to the outside; a collector layer formed on the sub-collector layer and made of n-type GaAs or undoped GaAs for collecting electrons; a base layer formed on the collector layer and made of p-type GaAs for controlling flow of electrons; an emitter layer formed on the base layer and made of n-type InGaP for emitting electrons; and an emitter contact layer formed on the emitter layer and made of n-type GaAs or n-type InGaAs for injecting electrons from the outside.

This thin-film multilayer structure can be produced by methods including MOVPE (metal organic vapor phase epitaxy) also known as MOCVD (Metal Organic Chemical Vapor Deposition) and molecular beam epitaxy (MBE).

Among these, metal organic vapor phase epitaxy is a method in which solid or liquid organic metal material is heated to be gasified, and supplied onto a substrate heated to a predetermined temperature, whereby the material is thermally decomposed or chemically reacted on the substrate, resulting in that a thin-film crystal is epitaxially grown on the substrate.

Molecular beam epitaxy is a method in which each of constituent elements of a thin-film crystal is vaporized in ultra-high vacuum from a different crucible, and is supplied in the form of molecular beams onto a substrate heated to a predetermined temperature, resulting in that a thin-film crystal is epitaxially grown on the substrate.

However, molecular beam epitaxy requires an ultra-high vacuum environment and is not suitable for epitaxial growth of phosphorus-based materials that require high steam pressure. Thus, for heterojunction bipolar transistors in which the emitter layer made of n-type InGaP should be epitaxially grown, only metal organic vapor phase epitaxy is used.

An epitaxial wafer for a heterojunction bipolar transistor is completed in which a thin-film multilayer structure is epitaxially grown on a substrate by means of these methods, and then, a heterojunction bipolar transistor is completed through a working process including patterning, etching, forming of electrodes (an emitter electrode, a base electrode, and a collector electrode), forming of an overcoat, and packaging.

BACKGROUND ART DOCUMENT(S)

Patent Document(s)

Patent Document 1: JP 2004-207548 A

SUMMARY OF THE INVENTION

Problems to be Solved

For high-performance mobile terminals, such as smart phones, since a large number of radio frequency power amplifiers have been used due to recent multiband development, it has been extremely important to ensure sustainability of batteries by improving electrical efficiency of heterojunction bipolar transistors used for radio frequency power amplifiers to reduce the power consumption.

To improve the electrical efficiency for reducing power consumption, it would be necessary to reduce the turn-on voltage and the on-resistance. Because of the structure of heterojunction bipolar transistors, since the collector electrode should be formed on the sub-collector layer exposed by removing the base layer and the base electrode by, for example, etching, the sub-collector layer should have a long distance conductive path along the substrate plane direction.

Reducing the resistance of the sub-collector layer by increasing the carrier concentration of it will lead to a reduction of on-resistance. However, too much increase in the carrier concentration of the sub-collector layer results in a problem that the current amplification factor is lowered, so that a necessary and sufficient gain cannot be obtained.

Accordingly, it is an object of the present invention to provide an epitaxial wafer for a heterojunction bipolar transistor and a heterojunction bipolar transistor capable of reducing the resistance of the sub-collector layer without reducing the current amplification factor.

Solution to the Problems

In order to achieve the object, one aspect of the present invention provides an epitaxial wafer for a heterojunction bipolar transistor, including a sub-collector layer made of n-type GaAs, the sub-collector layer containing n-type impurities having a covalent radius that is smaller than the covalent radius of the substitution site and n-type impurities having a covalent radius that is larger than the covalent radius of the substitution site.

It is preferable that, in the sub-collector layer, the sum ((A)+(B)) of the concentration (A) of the n-type impurities having a covalent radius that is smaller than the covalent radius of the substitution site and the concentration (B) of the n-type impurities having a covalent radius that is larger than the covalent radius of the substitution site be equal to or greater than $3\times10^{18}$ cm$^{-3}$ and equal to or less than $1\times10^{19}$ cm$^{-3}$.

It is preferable that, in the sub-collector layer, the ratio ((A)/(B)) of the concentration (A) of the n-type impurities having a covalent radius that is smaller than the covalent radius of the substitution site to the concentration (B) of the n-type impurities having a covalent radius that is larger than the covalent radius of the substitution site be equal to or greater than 2 and equal to or less than 5.

Another aspect of the present invention provides a heterojunction bipolar transistor including a sub-collector layer made of n-type GaAs, the sub-collector layer containing n-type impurities having a covalent radius that is smaller than the covalent radius of the substitution site and n-type impurities having a covalent radius that is larger than the covalent radius of the substitution site.

It is preferable that, in the sub-collector layer, the sum ((A)+(B)) of the concentration (A) of the n-type impurities having a covalent radius that is smaller than the covalent radius of the substitution site and the concentration (B) of the n-type impurities having a covalent radius that is larger than the covalent radius of the substitution site be equal to or greater than $3 \times 10^{18}$ cm$^{-3}$ and equal to or less than $1 \times 10^{19}$ cm$^{-3}$.

It is preferable that, in the sub-collector layer, the ratio ((A)/(B)) of the concentration (A) of the n-type impurities having a covalent radius that is smaller than the covalent radius of the substitution site to the concentration (B) of the n-type impurities having a covalent radius that is larger than the covalent radius of the substitution site be equal to or greater than 2 and equal to or less than 5.

DESCRIPTION OF EMBODIMENT

Hereinafter a preferred embodiment of the present invention will be described with reference to the accompanying drawings.

Figure 1:
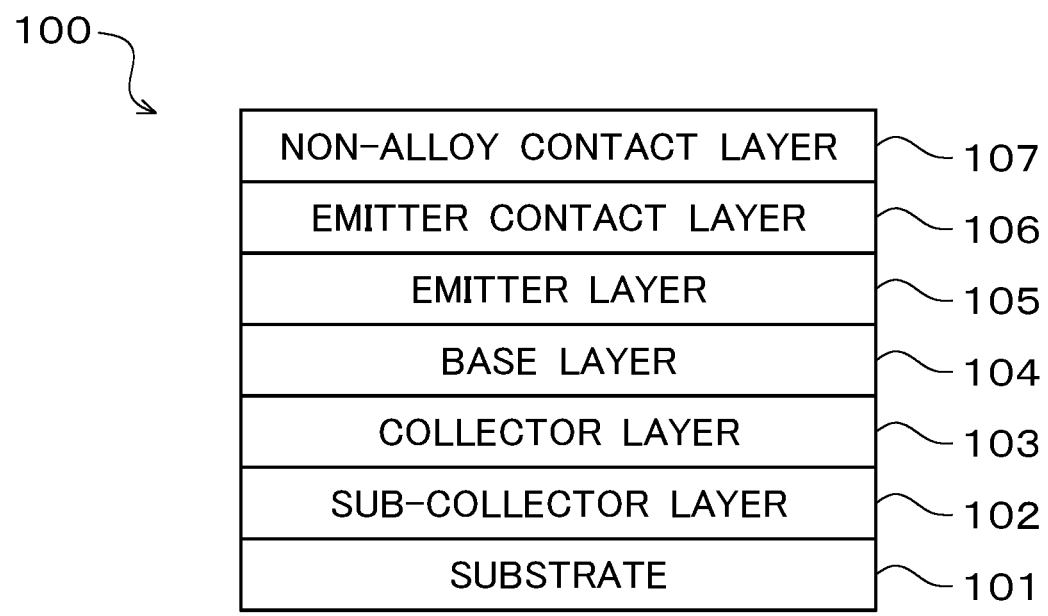
FIG. 1 is a schematic view showing the structure of an epitaxial wafer for a heterojunction bipolar transistor according to the present invention.

As shown in FIG. 1, an epitaxial wafer 100 for a heterojunction bipolar transistor according to a preferred embodiment of the present invention includes a substrate 101 made of semi-insulating GaAs; a sub-collector layer 102 formed on the substrate 101 and made of n-type GaAs; a collector layer 103 formed on the sub-collector layer 102 and made of n-type GaAs; a base layer 104 formed on the collector layer 103 and made of p-type GaAs; an emitter layer 105 formed on the base layer 104 and made of n-type InGaP; an emitter contact layer 106 formed on the emitter layer 105 and made of n-type GaAs; and a non-alloy contact layer 107 formed on the emitter contact layer 106 and made of n-type In$_x$Ga$_{1-x}$As (0<x<1).

In this epitaxial wafer 100 for a heterojunction bipolar transistor, the sub-collector layer 102 contains n-type impurities having a covalent radius that is smaller than the covalent radius of the substitution site and n-type impurities having a covalent radius that is larger than the covalent radius of the substitution site.

N-type impurities having a covalent radius that is smaller than the covalent radius of the substitution site may be, for example, Si (Ga site), Se (As site), or S (As site). N-type impurities having a covalent radius that is larger than the covalent radius of the substitution site may be, for example, Sn (Ga site) or Te (As site).

It is contemplated that a combination of n-type impurities having a covalent radius that is smaller than the covalent radius of the substitution site and n-type impurities having a covalent radius that is larger than the covalent radius of the substitution site may be, for example, a combination of Si and Sn, a combination of Si and Te, a combination of Se and Te, a combination of Se and Sn, a combination of S and Te, or a combination of S and Sn. In addition, a combination of three kinds of atoms, such as a combination of Si, Sn, and Te may be used.

In a case in which metal organic vapor phase epitaxy is used for epitaxial growth of the sub-collector layer 102, SiH$_4$ or Si$_2$H$_6$ is, for example, used as the material if n-type impurities are Si; H$_2$Se is, for example, used as the material if n-type impurities are Se; (CH$_3$)$_2$S, (C$_2$H$_5$)$_2$S, (C$_4$H$_9$S)$_2$, or H$_2$S is, for example, used as the material if n-type impurities are S; (CH$_3$)$_4$Sn or (C$_2$H$_5$)$_4$Sn is, for example, used as the material if n-type impurities are Sn; and (CH$_3$)$_2$Te or (C$_2$H$_5$)$_2$ Te is, for example, used as the material if n-type impurities are Te.

Figure 2:
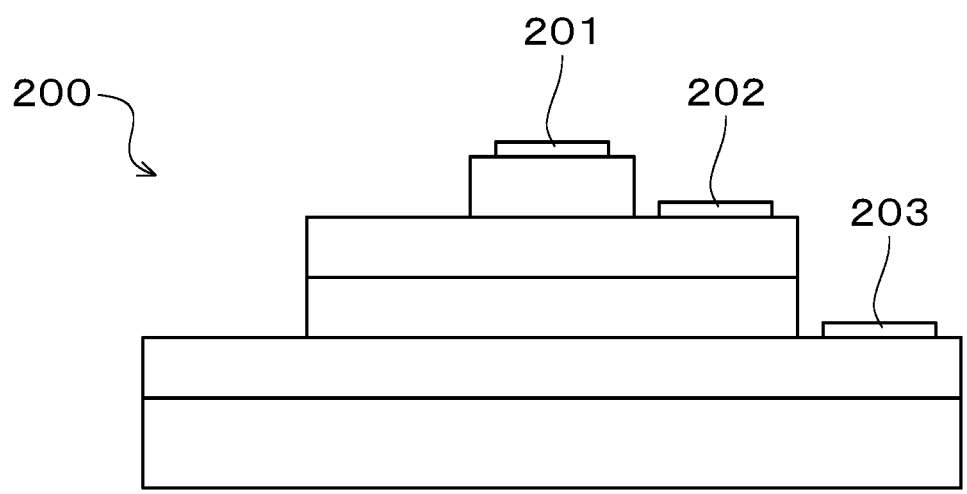
FIG. 2 is a schematic view showing the structure of a heterojunction bipolar transistor according to the present invention.

The epitaxial wafer 100 for a heterojunction bipolar transistor is subjected to several working steps so as to form an emitter electrode 201, a base electrode 202, and a collector electrode 203, whereby a heterojunction bipolar transistor 200 can be produced as shown in FIG. 2.

Hereinafter, the reason why the sub-collector layer 102 in the epitaxial wafer 100 for a heterojunction bipolar transistor contains two kinds of n-type impurities: n-type impurities having a covalent radius that is smaller than the covalent radius of the substitution site and n-type impurities having a covalent radius that is larger than the covalent radius of the substitution site will be described.

Usually, a sub-collector layer made of n-type GaAs contains only one kind of n-type impurities. For example, if the sub-collector layer contains Si as n-type impurities, since the covalent radius of Si is smaller than the covalent radius of Ga at the substitution site, addition of Si at a high concentration results in that a tensile stress is exerted in the thin-film crystal, vacancy defects are likely to occur. Furthermore, it is assumed that if Si is added at a higher concentration, vacancy defects propagate to the base layer, resulting in that the current amplification factor is lowered.

Accordingly, as a result of deep consideration, the inventors conceived that if, for example, Sn is added to the sub-collector layer in addition to Si, the vacancy defects caused by Si, of which the covalent radius is smaller than that of Ga at the substitution site, are compensated for by Sn, of which the covalent radius is larger than that of Ga at the substitution site, thereby significantly reducing the tensile stress in the thin-film crystal.

In this case, even if n-type impurities are added into the sub-collector layer at a high concentration, a thin-film crystal with less distortion and a good crystalline state can be obtained while restraining reduction of the current amplification factor.

Thus, it is defined that in the epitaxial wafer 100 for a heterojunction bipolar transistor, the sub-collector layer 102 contains two kinds of n-type impurities: n-type impurities having a covalent radius that is smaller than the covalent radius of the substitution site and n-type impurities having a covalent radius that is larger than the covalent radius of the substitution site.

In the sub-collector layer 102, the sum ((A)+(B)) of the concentration (A) of the n-type impurities having a covalent radius that is smaller than the covalent radius of the substitution site and the concentration (B) of the n-type impurities having a covalent radius that is larger than the covalent radius of the substitution site is preferably equal to or greater than $3 \times 10^{18}$ cm$^{-3}$ and equal to or less than $1 \times 10^{19}$ cm$^{-3}$, and is more preferably equal to or greater than $4 \times 10^{18}$ cm$^{-3}$ and equal to or less than $1 \times 10^{19}$ cm$^{-3}$.

If the sum ((A)+(B)) of the concentration (A) of the n-type impurities having a covalent radius that is smaller than the covalent radius of the substitution site and the concentration (B) of the n-type impurities having a covalent radius that is larger than the covalent radius of the substitution site is less than $3\times10^{18}$ cm$^{-3}$, the carrier concentration in the sub-collector layer 102 cannot be increased than that of the conventional technique, so that the resistance of the sub-collector layer 102 cannot be reduced than that of the conventional technique.

In addition, if the sum ((A)+(B)) of the concentration (A) of the n-type impurities having a covalent radius that is smaller than the covalent radius of the substitution site and the concentration (B) of the n-type impurities having a covalent radius that is larger than the covalent radius of the substitution site is greater than $1\times10^{19}$ cm$^{-3}$, the total concentration is close to the solid-solution limit for impurities in GaAs forming the sub-collector layer 102, so that it is difficult to add impurities at a higher concentration. Even if the total concentration does not reach the solid-solution limit, doping at a high concentration results in the generation of defects, which exert a force for compensating for carriers, so that the advantage cannot be achieved.

Furthermore, in the sub-collector layer 102, the ratio ((A)/(B)) of the concentration (A) of the n-type impurities having a covalent radius that is smaller than the covalent radius of the substitution site to the concentration (B) of the n-type impurities having a covalent radius that is larger than the covalent radius of the substitution site is preferably equal to or greater than 2 and equal to or less than 5, and is more preferably equal to or greater than 2 and equal to or less than 3.

As mentioned above, it is contemplated that, for example, Si (Ga site), Se (As site), or S (As site) may be adopted for the n-type impurities having a covalent radius that is smaller than the covalent radius of the substitution site, whereas, for example, Te (As site) may be adopted for the n-type impurities having a covalent radius that is larger than the covalent radius of the substitution site. However, since the growing temperature at which the addition efficiency is good for $H_2Se$ that is a material of Se and for $(C_2H_5)_2Te$ that is a material of Te is remarkably different from that for $S_2H_6$ that is a material of Si and for $(CH_3)_2S$ that is a material of S, if a combination of these materials is adopted, a growing temperature should be suitably selected such that the total concentration ((A)+(B)) of impurities is maximized and the ratio ((A)/(B)) is within the above-mentioned numerical range.

Although these materials of n-type impurities are adopted, it is possible to produce a sub-collector layer in which the sum ((A)+(B)) of the concentration (A) of the n-type impurities having a covalent radius that is smaller than the covalent radius of the substitution site and the concentration (B) of the n-type impurities having a covalent radius that is larger than the covalent radius of the substitution site is approximately $3\times10^{18}$ cm$^{-3}$ and the ratio ((A)/(B)) is equal to or greater than 2 and equal to or less than 5. Accordingly, the advantage of the present invention can be achieved to some degree.

Accordingly, increase in the carrier concentration in the sub-collector layer 102 and decrease in the current amplification factor are best balanced, so that a dramatic advantage can be obtained.

The heterojunction bipolar transistor 200 can be used not only for a radio frequency power amplifier for a high-performance mobile terminal, but also for a low output power amplifier for Wi-Fi, for which an HEMT (high electron mobility transistor) has been usually used.

As described above, the present invention can provide an epitaxial wafer for a heterojunction bipolar transistor and a heterojunction bipolar transistor capable of reducing the resistance of the sub-collector layer without reducing the current amplification factor.

EXAMPLES

Hereinafter, the reason for the numerical limitations in the present invention will be described.

Epitaxial wafers for heterojunction bipolar transistors were produced by epitaxially growing a sub-collector layer made of n-type GaAs, a collector layer made of n-type GaAs, a base layer made of p-type GaAs, an emitter layer made of n-type InGaP, an emitter contact layer made of n-type GaAs, and a non-alloy contact layer made of n-type $In_xGa_{1-x}As$ (0<x<1) on a substrate in this order.

At this time, $Si(Si_2H_6)$ and $Sn((CH_3)_4Sn)$ were used as a combination of the n-type impurity materials for which the growing temperatures for good addition efficiency are similar. Multiple epitaxial wafers for heterojunction bipolar transistors were produced in which the ratio of the concentration of Si impurities to the concentration of Sn impurities was varied, and the total concentration of impurities was varied.

Then, heterojunction bipolar transistors were produced by applying several working steps to the epitaxial wafers for heterojunction bipolar transistors.

With regard to the heterojunction bipolar transistors, a relationship between the total concentration of impurities in the sub-collector layer and the current amplification factor was studied.

Figure 3:
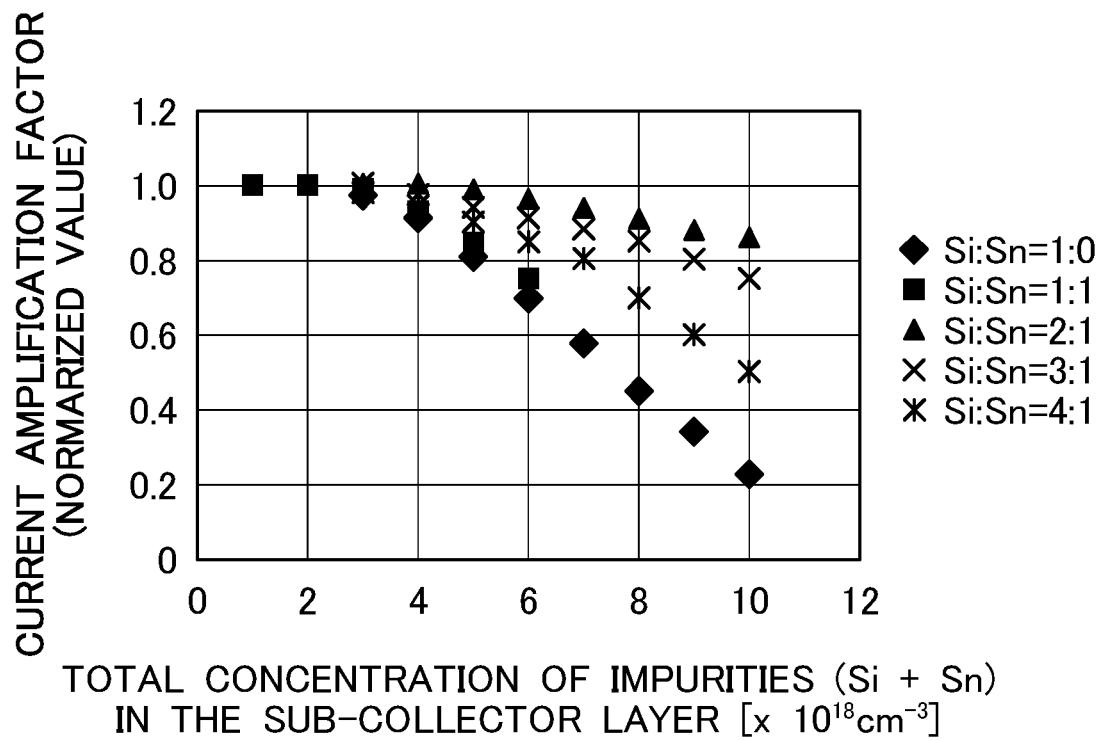
FIG. 3 is a diagram showing a relationship between the total concentration of impurities in the sub-collector layer and the current amplification factor.

As a result, it was confirmed that the drop of the current amplification factor could be restrained while reducing the resistance of the sub-collector layer and the advantage of the present invention could be achieved if the sum ((A)+(B)) of the concentration (A) of the n-type impurities having a covalent radius that is smaller than the covalent radius of the substitution site and the concentration (B) of the n-type impurities having a covalent radius that is larger than the covalent radius of the substitution site was equal to or greater than $3\times10^{18}$ cm$^{-3}$ and equal to or less than $1\times10^{19}$ cm$^{-3}$, and if the ratio ((A)/(B)) of the concentration (A) of the n-type impurities having a covalent radius that is smaller than the covalent radius of the substitution site to the concentration (B) of the n-type impurities having a covalent radius that is larger than the covalent radius of the substitution site was equal to or greater than 2 and equal to or less than 5, as shown in FIG. 3.

Furthermore, for combinations other than the combination of Si and Sn, it was also confirmed that the drop of the current amplification factor could be restrained while reducing the resistance of the sub-collector layer and the advantage of the present invention could be achieved.

The invention claimed is:

1. An epitaxial wafer for a heterojunction bipolar transistor comprising:
   a sub-collector layer made of n-type GaAs, the sub-collector layer containing n-type impurities having a covalent radius that is smaller than the covalent radius of the substitution site and n-type impurities having a covalent radius that is larger than the covalent radius of the substitution site,
   wherein in the sub-collector layer, a sum ((A)+(B)) of a concentration (A) of the n-type impurities having a covalent radius that is smaller than the covalent radius of the substitution site and a concentration (B) of the n-type impurities having a covalent radius that is larger than the covalent radius of the substitution site is equal to or greater than $3\times10^{18}$ cm$^{-3}$ and equal to or less than $1\times10^{19}$ cm$^{-3}$.

2. A heterojunction bipolar transistor comprising:
a sub-collector layer made of n-type GaAs, the sub-collector layer containing n-type impurities having a covalent radius that is smaller than the covalent radius of the substitution site and n-type impurities having a covalent radius that is larger than the covalent radius of the substitution site,
wherein in the sub-collector layer, a sum ((A)+(B)) of a concentration (A) of the n-type impurities having a covalent radius that is smaller than the covalent radius of the substitution site and a concentration (B) of the n-type impurities having a covalent radius that is larger than the covalent radius of the substitution site is equal to or greater than $3\times10^{18}$ cm$^{-3}$ and equal to or less than $1\times10^{19}$ cm$^{-3}$.

3. The epitaxial wafer for a heterojunction bipolar transistor according to claim 1, wherein in the sub-collector layer, a ratio ((A)/(B)) of a concentration (A) of the n-type impurities having a covalent radius that is smaller than the covalent radius of the substitution site to a concentration (B) of the n-type impurities having a covalent radius that is larger than the covalent radius of the substitution site is equal to or greater than 2 and equal to or less than 5.

4. The heterojunction bipolar transistor according to claim 2, wherein in the sub-collector layer, a ratio ((A)/(B)) of a concentration (A) of the n-type impurities having a covalent radius that is smaller than the covalent radius of the substitution site to a concentration (B) of the n-type impurities having a covalent radius that is larger than the covalent radius of the substitution site is equal to or greater than 2 and equal to or less than 5.

* * * * *